(12) United States Patent
Zhou (10) Patent No.: US 11,037,936 B2
(45) Date of Patent: Jun. 15, 2021

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/554,964

(22) Filed: Aug. 29, 2019

(65) Prior Publication Data

US 2020/0075603 A1 Mar. 5, 2020

(30) Foreign Application Priority Data

Aug. 29, 2018 (CN) .......................... 201810993685.2

(51) Int. Cl.
*H01L 21/02* (2006.01)
*H01L 21/768* (2006.01)
*H01L 21/321* (2006.01)
*H01L 21/82* (2006.01)
*H01L 21/84* (2006.01)
(Continued)

(52) U.S. Cl.
CPC ...... *H01L 27/1104* (2013.01); *H01L 21/0217* (2013.01); *H01L 21/02164* (2013.01); *H01L 21/02167* (2013.01); *H01L 21/32133* (2013.01); *H01L 21/7684* (2013.01); *H01L 21/76802* (2013.01); *H01L 21/76819* (2013.01); *H01L 21/76849* (2013.01); *H01L 21/76877* (2013.01); *H01L 21/823431* (2013.01); *H01L 21/823437* (2013.01); *H01L 21/823475* (2013.01); *H01L 23/528* (2013.01); *H01L 27/0886* (2013.01); *H01L 29/66545* (2013.01)

(58) Field of Classification Search
CPC .................................................. H01L 21/76877
See application file for complete search history.

(56) References Cited

U.S. PATENT DOCUMENTS

2018/0005904 A1* 1/2018 Lee .................. H01L 21/823807
2019/0371933 A1* 12/2019 Chen .................... H01L 21/7684
2019/0385946 A1* 12/2019 Xie ................. H01L 21/823475

* cited by examiner

*Primary Examiner* — Omar F Mojaddedi
(74) *Attorney, Agent, or Firm* — Anova Law Group, PLLC (57) ABSTRACT

Semiconductor device and fabrication method are provided. The method includes a base substrate including a first region, a second region, and a third region arranged in a first direction; a first doped layer at the first region and a second doped layer at the third region; a first gate structure at the second region; a first dielectric layer on the base substrate; forming first trenches in the first dielectric layer, where the first trenches include second sub-regions arranged in a direction in parallel with a second direction, and a minimum distance between a second sub-region and a contact region of the first gate structure is greater than zero; forming a first conductive layer in the first trenches; forming a second conductive layer on a surface of the first conductive layer at the second sub-regions; and forming a third conductive layer on the contact region of the first gate structure.

19 Claims, 8 Drawing Sheets

(51) Int. Cl.
*H01L 27/11* (2006.01)
*H01L 21/3213* (2006.01)
*H01L 21/8234* (2006.01)
*H01L 27/088* (2006.01)
*H01L 29/66* (2006.01)
*H01L 23/528* (2006.01)

SEMICONDUCTOR DEVICE AND FABRICATION METHOD THEREOF

CROSS-REFERENCE TO RELATED APPLICATION

This application claims the priority of Chinese Patent Application No. 201810993685.2, filed on Aug. 29, 2018, the content of which is incorporated herein by reference in its entirety.

TECHNICAL FIELD

The present disclosure generally relates to the field of semiconductor manufacturing and, more particularly, relates to a semiconductor device and its fabrication method.

BACKGROUND

With the rapid development of semiconductor technology, the semiconductor devices present a development trend of high element density and high integration. Conventional planar semiconductor devices have weak control on channel current, which may cause short-channel effect and leakage current, thereby affecting the electrical performance of the semiconductor devices.

In order to overcome the short-channel effect and control the leakage current, a fin field effect transistor (FinFET), a common multi-gate device, has been used in the existing technology. Layers of the FinFET may include fins and an isolation layer on a semiconductor substrate, a gate electrode layer on the top surface of the isolation layer and also on top surfaces and sidewall surfaces of the fins, and source regions and drain regions in the fins on both sides of the gate electrode layer. The isolation layer may cover a portion of the sidewalls of the fins, and the top surface of the isolation layer may be lower than the top surface of the fins.

SUMMARY

One aspect of the present disclosure provides a method for fabricating a semiconductor device. The method includes providing a base substrate including a first region, a second region, and a third region arranged along a first direction, where the second region is between the first region and the third region, and the second region is adjacent to each of the first region and the third region; a first doped layer in the base substrate at the first region and a second doped layer in the base substrate at the third region, where the first doped layer and the second doped layer are arranged along the first direction; a first gate structure on the base substrate at the second region, where an extending direction of the first gate structure is a second direction in parallel with or perpendicular to the first direction, and a contact region is at a top of the first gate structure; forming a first dielectric layer on the base substrate, where the first dielectric layer covers the first doped layer, the second doped layer, and sidewalls of the first gate structure; forming first trenches in the first dielectric layer at the first region and the third region respectively, where the first trenches respectively expose the first doped layer and the second doped layer, each first trench includes a first sub-region adjacent to the second region and a second sub-region away from the second region, arranged along a direction in parallel with the second direction, and a minimum distance between a second sub-region and the contact region of the first gate structure is greater than zero; forming a first conductive layer in the first trenches; forming a second conductive layer on a surface of the first conductive layer at the second sub-regions after forming the first conductive layer; and forming a third conductive layer on the contact region of the first gate structure.

Another aspect of the present disclosure provides a semiconductor device fabricated by embodiments of the present disclosure. The semiconductor device includes a base substrate including a first region, a second region, and a third region arranged along a first direction, where the second region is between the first region and the third region, and the second region is adjacent to each of the first region and the third region; a first doped layer in the base substrate at the first region and a second doped layer in the base substrate at the third region, where the first doped layer and the second doped layer are arranged along the first direction; a first gate structure on the base substrate at the second region, where an extending direction of the first gate structure is a second direction in parallel with or perpendicular to the first direction, and a contact region is at a top of the first gate structure; a first dielectric layer on the base substrate, where the first dielectric layer covers the first doped layer, the second doped layer, and sidewalls of the first gate structure; first trenches in the first dielectric layer at the first region and the third region respectively, where the first trenches respectively expose the first doped layer and the second doped layer, each first trench includes a first sub-region adjacent to the second region and a second sub-region away from the second region, arranged along a direction in parallel with the second direction, and a minimum distance between a second sub-region and the contact region of the first gate structure is greater than zero; a first conductive layer in the first trenches; a second conductive layer on a surface of the first conductive layer at the second sub-regions after forming the first conductive layer; and a third conductive layer on the contact region of the first gate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor device and a fabrication method are provided. The method includes a base substrate including a first region, a second region, and a third region arranged in a first direction; a first doped layer at the first region and a second doped layer at the third region; a first gate structure at the second region; a first dielectric layer on the base substrate; forming first trenches in the first dielectric layer, where the first trenches include second sub-regions arranged in a direction in parallel with the second direction, and a minimum distance between a second sub-region and the contact region of the first gate structure is greater than zero; forming a first conductive layer in the first trenches; forming a second conductive layer on a surface of the first conductive layer at the second sub-regions; and forming a third conductive layer on the contact region of the first gate structure.

Figure 1:
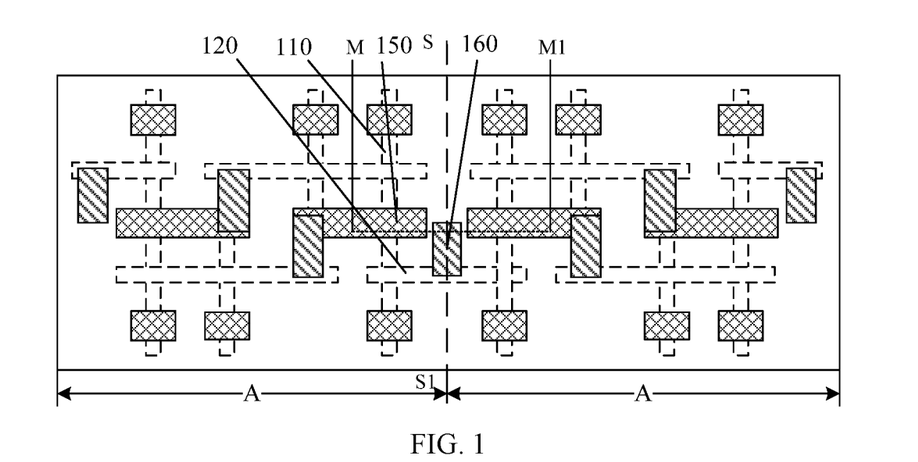
FIGS. 1-2 illustrate layer schematics for forming a semiconductor device.
Figure 2:
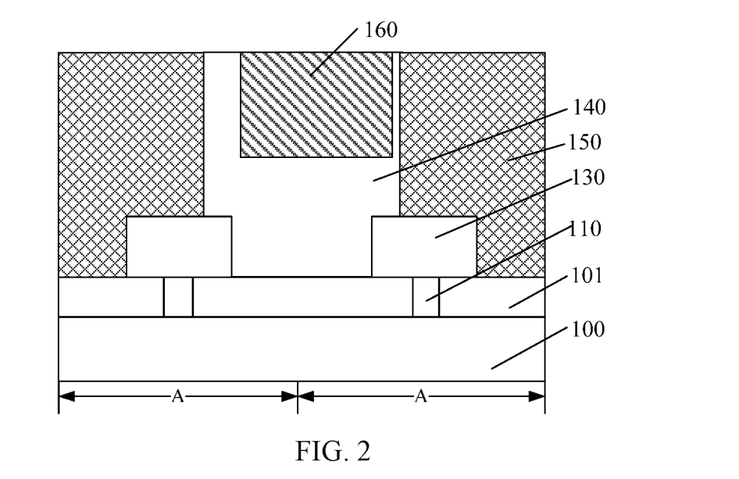

FIGS. 1-2 illustrate layer schematics corresponding to an exemplary static random-access memory (SRAM) device.

Referring to FIG. 1 and FIG. 2, FIG. 1 illustrates a top-view schematic of a semiconductor device, and FIG. 2 illustrates a cross-sectional schematic along a section line M-M1 in FIG. 1. A substrate 100 may include adjacent device regions A which may be mirror connected along an axis S-S1. A surface of the substrate 100 at the device regions A may have fins 110 and an isolation layer 101. The isolation layer 101 may cover a portion of sidewalls of the fins 110, and the fins 110 of the adjacent device regions A may be adjacent to each other. A gate electrode layer 120 may cross the adjacent fins 110 at the adjacent device regions A. Doped source/drain layers 130 may be in the fins 110 on both sides of the gate electrode layer 120 at the device regions A, and at least one doped source/drain layer 130 may be adjacent to another doped source/drain layer 130 of the adjacent device region A. A dielectric layer 140 over the substrate may cover top surfaces of the doped source/drain layers 130, and also cover a top surface and sidewall surfaces of the gate electrode layer 120. A first conductive layer 150 and a second conductive layer 160 may be in the dielectric layer 140. The first conductive layer 150 may cross the doped source/drain layers 130 and cover a portion of the top surfaces and the sidewall surfaces of the doped source/drain layers 130. The second conductive layer 160 may cover a portion of the top surface of the first gate electrode layer 120.

In the above-mentioned embodiments, the first conductive layer may be used to connect a first metal interconnect layer to the doped source/drain layers, and the second conductive layer may be used to connect the first metal interconnect layer to the gate electrode layer. After forming the first conductive layer, the second conductive layer may be formed. When forming the second conductive layer, a photolithography process may be required to form trenches. Positions of the trenches may be misaligned due to the precision limitation of the photolithography process, so the distances between one trench and each of the two adjacent first conductive layers 150 may not be equal. If the dielectric layer between the second conductive layer 160 and the first conductive layer 150 is too thin, leakage may be caused easily. Especially, when the trench is greatly misaligned, a bridging between the first conductive layer 150 and the second conductive layer 160 may also be formed easily, which may result in poor performance of the formed semiconductor device.

The present disclosure provides a fabrication method of the semiconductor device. First trenches may be formed in a dielectric layer, and a first conductive layer may be formed in the first trenches. Each of the first trenches may include a second sub-region, and a minimum distance between the second sub-region and a contact region of the first gate structure may be greater than zero. A second conductive layer may be on the first conductive layer at the second sub-regions, and a third conductive layer may be on the contact region of the first gate structure, so a minimum distance between the second conductive layer and the third conductive layer may be greater than zero. The minimum distance between the second conductive layer and the third conductive layer may be adjusted by controlling the distance between the second sub-region and the contact region of the first gate structure, which may prevent leakage between the second conductive layer and the third conductive layer. In such way, the isolation effect between the second conductive layer and the third conductive layer may be improved, thereby improving the performance of the semiconductor device.

In order to further illustrate the above described objects, features, and advantages of the present disclosure, various specific embodiments of the present disclosure will be described in detail below with reference to the accompanying drawings.

FIGS. 3-15 illustrate layer schematics corresponding to certain stages for forming an exemplary semiconductor device according to various disclosed embodiments of the present disclosure. FIG. 16 illustrates a flowchart of an exemplary fabrication method for forming a semiconductor structure according to various disclosed embodiments of the present disclosure.

Figure 3:
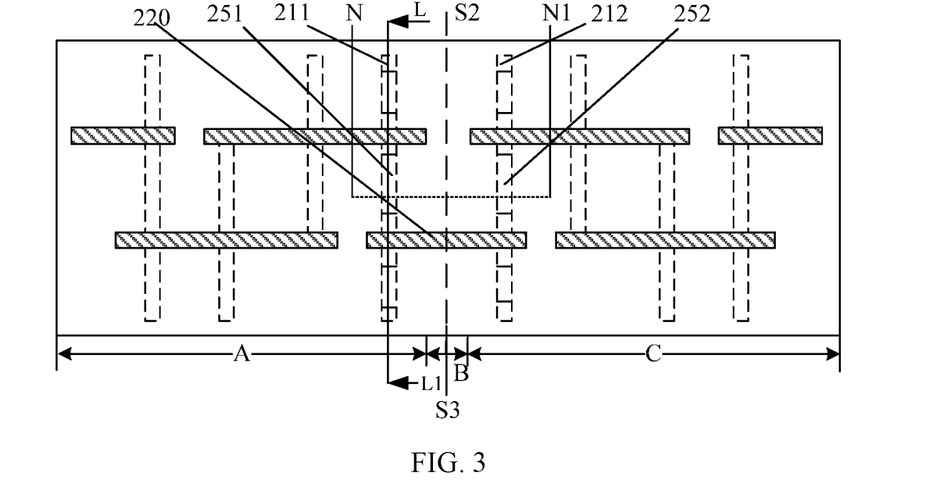
FIGS. 3-15 illustrate layer schematics corresponding to certain stages for forming an exemplary semiconductor device according to various disclosed embodiments of the present disclosure.
Figure 4:
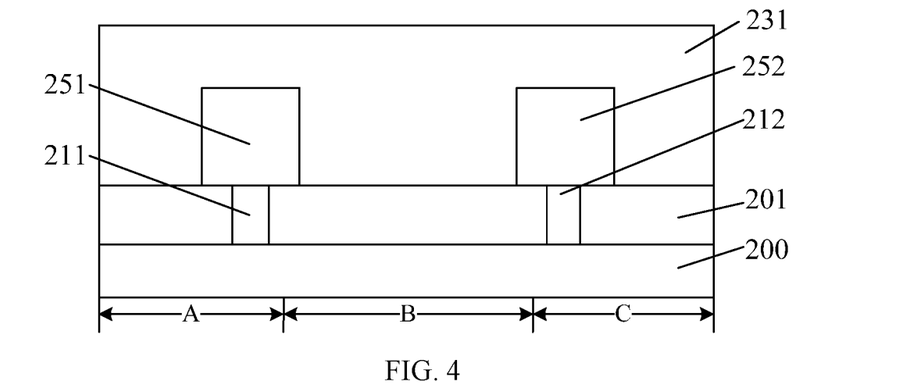
Figure 5:
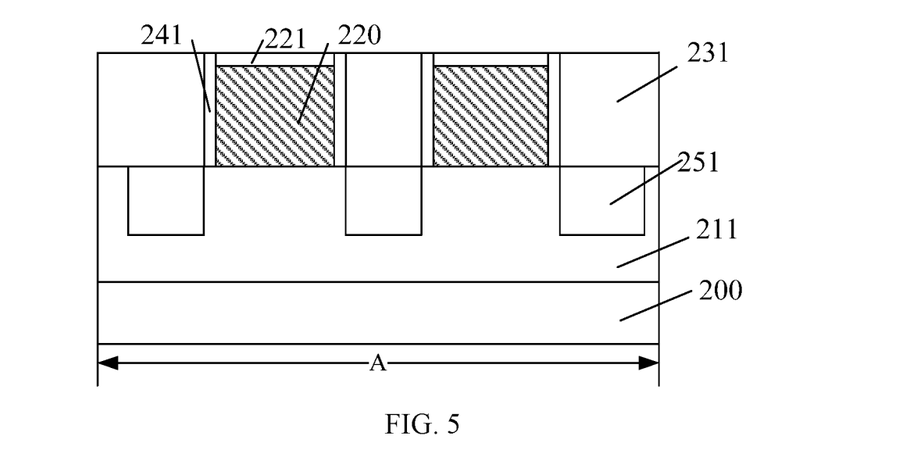

Referring to FIGS. 3-5, FIG. 3 illustrates a top-view schematic of a semiconductor device. FIG. 4 illustrates a cross-sectional schematic along a section line N-N1 in FIG. 3. FIG. 5 illustrates a cross-sectional schematic along a section line L-L1 in FIG. 3. A base substrate may be provided, and the base substrate may include a first region A, a second region B, and a third region C arranged in a first direction (e.g., in S401 of FIG. 16). The second region B may be between the first region A and the third region C. The second region B may be adjacent to each of the first region A and the third region C.

In one embodiment, the base substrate may further include a first device region and a second device region adjacent to the first device region. The first region A and a portion of the second region B may be in the first device region. The third region C and a portion of the second region B may be in the second device region. The first device region and the second device region may be symmetrically distributed along an axis. The symmetry axis may be coincided with a centerline S2-S3 of the second region B.

A first doped layer 251 may be in the base substrate at the first region A, and a second doped layer 252 may be in the base substrate at the third region C; and the first doped layer 251 and the second doped layer 252 may be arranged in the first direction (e.g., in S402 of FIG. 16).

Although only the first device region and the second device region adjacent to the first device region are illustrated in FIG. 3, any number of adjacent device regions may be included in the present disclosure.

In one embodiment, the first device region and the second device region may be configured to form a static random-access memory.

In one embodiment, the first device region and the second device region may be configured to form a p-channel metal-oxide-semiconductor (PMOS) transistor or an n-channel metal-oxide-semiconductor NMOS transistor.

A first gate structure may be on the base substrate at the second region B. An extending direction of the first gate structure may be a second direction which may be in parallel with or perpendicular to the first direction, and a contact region may be at a top of the first gate structure (e.g., in S403 of FIG. 16).

In one embodiment, a first dummy gate structure 220 may be in the base substrate at the second region B, and a contact region 2201 may be at a top of the first dummy gate structure 220.

A first fin 211 and a second fin 212 may be on the base substrate, where the first fin 211 may be at the first region A of the base substrate and the second fin 212 may be at the third region C of the base substrate. The first dummy gate structure 220 may also at the first region A and the third region C of the base substrate. An extending direction of the first dummy gate structure 220 may be in parallel with the first direction. The first dummy gate structure 220 may cross the first fin 211 and the second fin 212 and also cover a portion of sidewall surfaces and top surfaces of the first fin 211 and the second fin 212. The first doped layer 251 may be in the first fin 211 on both sides of the first dummy gate structure 220, and the second doped layer 252 may be in the second fin 212 on both sides of the first dummy gate structure 220.

In one embodiment, the first fin 211 and the second fin 212 may be used as fins of a pass transistor and a pull-down transistor.

The base substrate may include a semiconductor substrate 200. The first fin 211, the second fin 212, and the first dummy gate structure 220 may be on the semiconductor substrate 200.

The semiconductor substrate 200 may be made of a material including silicon, germanium, silicon germanium, gallium arsenide, indium gallium arsenide, or any other suitable material(s), where the silicon material may include mono-crystalline silicon, polycrystalline silicon or amorphous silicon. The semiconductor substrate 200 may also be a semiconductor-on-insulator layer. The semiconductor-on-insulator layer may include an insulator and a semiconductor material layer on the insulator, where the semiconductor material layer may be made of a material including silicon, germanium, silicon germanium, gallium arsenide, indium gallium arsenide, or any other suitable material(s).

In one embodiment, the material of the semiconductor substrate 200 may be mono-crystalline silicon.

In one embodiment, the first fin 211 and the second fin 212 may be formed by patterning the semiconductor substrate 200.

In one embodiment, the material of the first fin 211 and the second fin 212 may be mono-crystalline silicon. In other embodiments, the material of the first fin 211 and the second fin 212 may be monocrystalline silicon germanium or any other suitable semiconductor material(s).

In one embodiment, the fabrication method may further include forming an isolation layer 201 on the semiconductor substrate 200. The isolation layer 201 may cover a portion of sidewall surfaces of the first fin 211 and the second fin 212. The isolation layer 201 may be made of a material including silicon dioxide.

In one embodiment, the first dummy gate structure 220 may include a dummy gate dielectric layer and a dummy gate electrode layer on the dummy gate dielectric layer. The material of the dummy gate dielectric layer may be silicon oxide and the material of the dummy gate electrode layer may be polycrystalline silicon.

A first dielectric layer 231 may be formed on the base substrate; and the first dielectric layer 231 may cover the first doped layer 251, the second doped layer 252, and the sidewalls of the first dummy gate structure 220 (e.g., in S404 of FIG. 16).

In one embodiment, after forming the first dielectric layer 231 and before forming first trenches, the first gate structure may be formed.

The method for forming the first gate structure may include: removing the first dummy gate structure to form a gate opening; and forming the first gate structure in the gate opening.

The first gate structure may include a gate dielectric layer and a gate electrode layer on the gate dielectric layer. The gate dielectric layer may be made of a high K (K greater than 3.9) dielectric material. The gate electrode layer may be made of a metal including tungsten.

In one embodiment, before forming the first dielectric layer, the fabrication method may further include: forming the first doped layer 251 in the first fin 211 on both sides of the first dummy gate structure 220; and forming the second doped layer 252 in the second fin 212 on both sides of the first dummy gate structure 220.

The first doped layer 251 and the second doped layer 252 may be formed by an epitaxial process or an ion implantation process.

In one embodiment, the first doped layer 251 and the second doped layer 252 may be formed by the epitaxial process.

The method for forming the first doped layer 251 may include: forming a first trench in the first fin 210 on both sides of the first dummy gate structure 220; and forming the first doped layer 251 in the first trench using the epitaxial process.

The method for forming the second doped layer 252 may include: forming a second trench in the first fin 210 on both sides of the first dummy gate structure 220; and forming the second doped layer 252 in the second trench using the epitaxial process.

In one embodiment, the first doped layer and the second doped layer may be formed using the ion implantation process. The ion implantation may be performed in the first fin and the second fin on both sides of the first dummy gate structure to form the first doped layer and the second doped layer.

In one embodiment, a protection layer may be on the tops of the first doped layer 251 and the second doped layer 252. The protection layer may protect the first doped layer and the second doped layer when forming other different types of source/drain doped layers.

The material of the protection layer may be different from the material of the dielectric layer. The protection layer may be made of a material including silicon nitride, silicon oxynitride, silicon oxycarbide, silicon carbonitride or silicon oxycarbonitride.

In one embodiment, the material of the protection layer may be silicon nitride, and the material of the dielectric layer may be silicon oxide. The silicon nitride may have a good etching selectivity with respect to the silicon oxide. Therefore, when etching the dielectric layer subsequently, the silicon oxide may be ensured to be removed and the silicon nitride may be less etched simultaneously, thereby better protecting the doped source/drain layers.

The first doped layer 251 and the second doped layer 252 may have source/drain ions.

When the semiconductor device is N-type, the conductivity type of the source/drain ions may be N-type, such as phosphorus ions. When the semiconductor device is P-type, the conductivity type of the source/drain ions may be P-type, such as boron ions.

The first dielectric layer 231 may be made of a material including silicon oxide, silicon nitride, silicon boronitride, silicon oxycarbonitride, silicon oxynitride.

In one embodiment, the material of the first dielectric layer 231 may be silicon oxide.

In one embodiment, the first fin and the second fin may be on the base substrate. The extending direction of the first fin and the second fin may be in parallel with the first direction. The first fin and the second fin may be at the first region, the second region and the third region of the substrate. The extending direction of the first gate structure may be perpendicular to the first direction. The first gate structure may cross the first fin and the second fin. The first doped layer and the second doped layer may be in the first fin and the second fin on both sides of the first gate structure.

Figure 6:
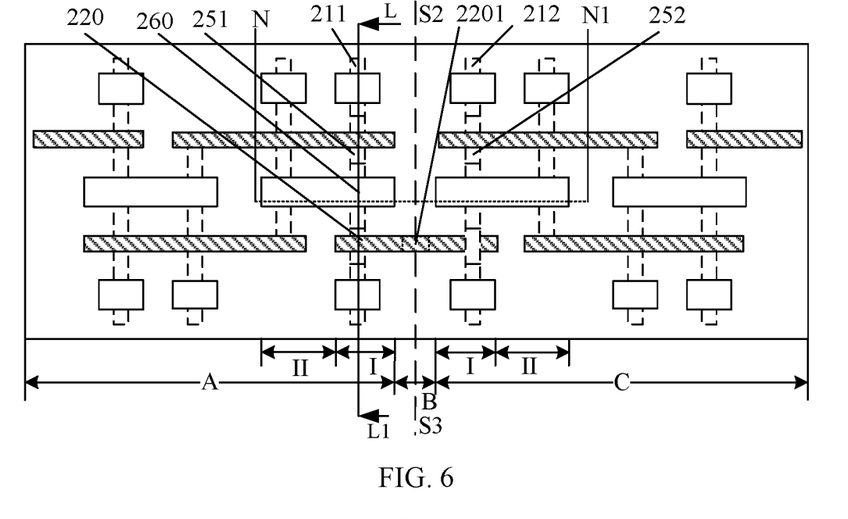
Figure 7:
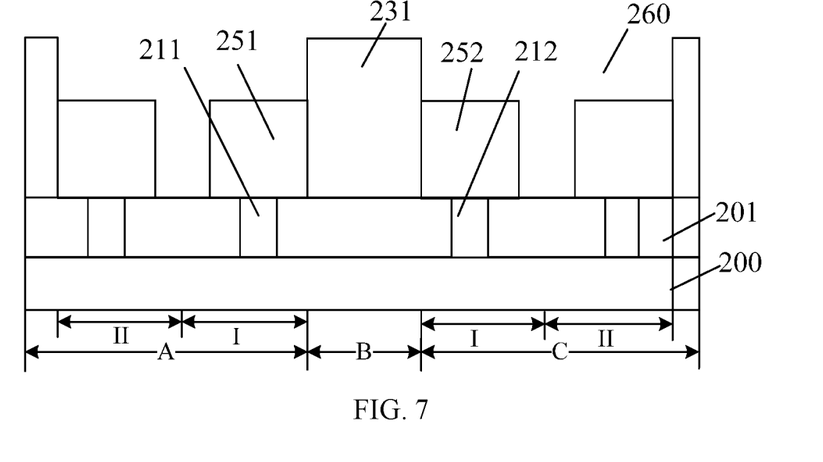

Referring to FIG. 6 and FIG. 7, FIG. 7 illustrates a cross-sectional schematic along a section line N-N1 in FIG. 6. First trenches 260 may be respectively formed in the first dielectric layer 231 at the first region A and the third region C and may respectively expose the first doped layer 251 and the second doped layer 252 (e.g., in S405 of FIG. 16).

The bottoms of the first trenches 260 may expose a portion of the tops and sidewalls of the first doped layer 251 and the second doped layer 252, and also a portion of the top surface of the isolation layer 201.

The first trenches 260 may include first sub-regions I and second sub-regions II arranged in a direction in parallel with the second direction. In the direction in parallel with the second direction, a minimum distance between a cross-section of the first sub-region I in parallel with the first direction and a center of the contact region 2201 of the first dummy gate structure 220 may be less than a minimum distance between a cross-section of the second sub-region II in parallel with the first direction and a center of the contact region 2201 of the first dummy gate structure 220. The minimum distance between the second sub-region II and the contact region 2201 of the first dummy gate structure 220 may be greater than zero.

In a direction in parallel with the extending direction of the first dummy gate structure 220, a minimum distance between an edge of the second sub-region II and an edge of the contact region 2201 of the first dummy gate structure 220 may be about 5 nm.

If the distance between the second sub-region of the first trench and the contact region 2201 of the first dummy gate structure 220 is relatively small, leakage may occur easily between the second conductive layer and the third conductive layer. If the distance between the second sub-region of the first trench and the contact region 2201 of the first dummy gate structure 220 is relatively large, the size of the second sub-region of the first trench may be too small and the resistance between the first conductive layer and the second conductive layer, which are formed subsequently, may be relatively large, which may be disadvantageous for forming the semiconductor device.

The first trenches 260 may provide space for the subsequent formation of the first conductive layer.

In one embodiment, the tops of the first doped layer 251 and the second doped layer 252 may have the protection layer. The method for forming the first trenches 260 may further include removing the protection layer on the surfaces of the first doped layer 251 and the second doped layer 252 exposed by the first trenches 260.

The method for forming the first trenches 260 may include: forming a first pattern layer on the surfaces of the first dielectric layer 231 and the first dummy gate structure 220, where the pattern layer may expose a portion of the surface of the first dielectric layer 231; and using the pattern layer as a mask, etching the first dielectric layer 231 till exposing a portion of the tops and sidewalls of the first doped layer 251 and the second doped layer 252 and a portion of the top surface of the isolation layer 201 to form the first trenches 260 in the first dielectric layer 231.

The first pattern layer may be made of a material including a photoresist.

After forming the first trenches 260, the first pattern layer may be removed by an ashing process.

The first conductive layer may be formed in the first trenches (e.g., in S406 of FIG. 16).

In one embodiment, the method for forming the first conductive layer may include: forming a first conductive material layer in the first trenches and on the first dielectric layer; and planarizing the first conductive material layer till exposing the surface of the first dielectric layer to form the first conductive layer in the first trenches.

In one embodiment, the fabrication method may further include: forming an insulation layer on the top surface of the first conductive layer. The material of the insulation layer may be different from the material of the first dielectric layer. The method for forming the first conductive layer and the insulation layer, refer to FIGS. 8-10.

Figure 8:
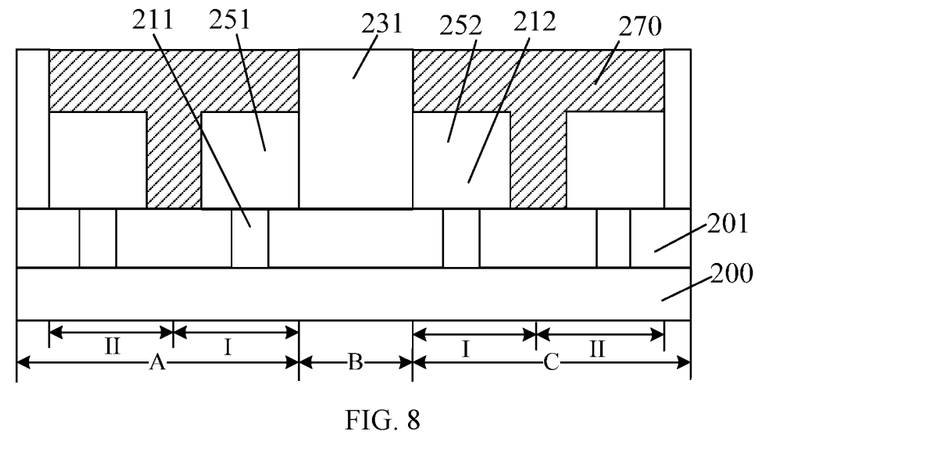

Referring to FIG. 8, the cross-sectional directions of FIG. 7 and FIG. 8 are consistent. A first initial conductive layer 270 may be formed in the first trenches 260.

The first initial conductive layer 270 may provide a material for subsequent formation of the first conductive layer.

The method for forming the first initial conductive layer 270 may include: forming a first initial conductive material layer (not shown) in the first trenches 260 and on the first dielectric layer 231; and planarizing the first initial conductive material layer till exposing the surface of the first dielectric layer 231 to form the first initial conductive layer 270 in the first trenches 260.

The first initial conductive layer 270 may cover the first doped layer 251 and the second doped layer 252.

The first initial conductive layer 270 may be made of a metal including tungsten, cobalt, titanium or nickel.

In one embodiment, the material of the first initial conductive layer 270 may be tungsten.

The first initial conductive material layer may be formed by a deposition process including a chemical vapor deposition process, a physical vapor deposition process or an atomic layer deposition process.

Before forming the first initial conductive material layer, the fabrication method may further include forming a metal layer (not shown) on the top surfaces and sidewall surfaces of the doped source/drain layers exposed by the bottoms of the first trenches 260.

The metal layer may be on the first dielectric layer 231.

The first metal layer may be made of a material including titanium, cobalt, or nickel.

The metal layer may be formed by a deposition process including a sputtering process.

After forming the metal layer, an annealing treatment may be performed on the metal layer, the first doped layer 251 and the second doped layer 252. A metal silicide layer (not shown) may be formed on the surfaces of the first doped layer 251 and the second doped layer 252, which are exposed by the first trenches 260.

In one embodiment, when performing the annealing treatment, atoms of the metal layer may diffuse to the first doped layer 251 and the second doped layer 252 and may react with the material of the first doped layer 251 and the second doped layer 252 to form the metal silicide layer.

In one embodiment, the surface material of the first doped layer 251 and the second doped layer 252 may be doped with source/drain ions, so the metal silicide layer may be doped with the source/drain ions which may reduce the resistance of the metal silicide layer.

In one embodiment, before the subsequent annealing treatment, a blocking layer (not shown) may be formed on the surface of the metal layer. The blocking layer may be made of a material including titanium nitride or tantalum nitride. The forming process for the blocking layer may be a deposition process such as a sputtering process.

In one embodiment, the blocking layer may be formed before the annealing treatment. During the annealing treatment, the blocking layer may protect the metal layer and block the annealing treatment from oxidizing the metal layer.

In some embodiments, the blocking layer may be formed after the annealing treatment.

In some embodiments, the blocking layer may not be formed.

Figure 9:
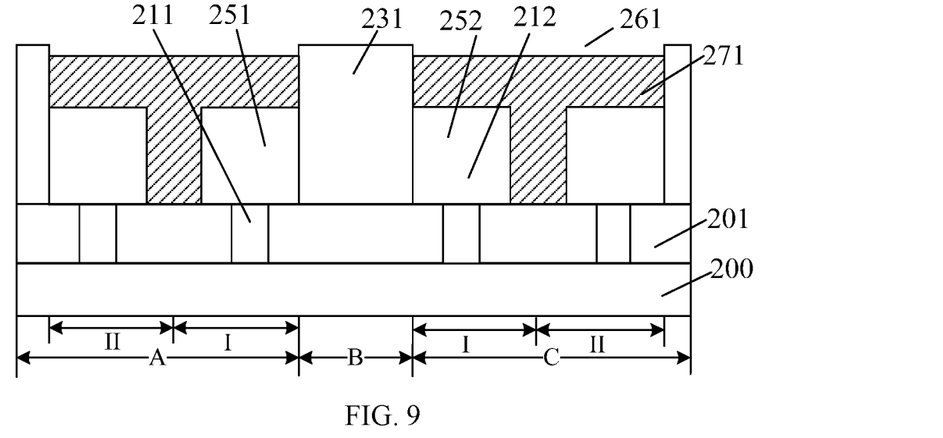

Referring to FIG. 9, the cross-sectional directions of FIG. 9 and the FIG. 8 are consistent. A portion of the first initial conductive layer 270 may be etched back to form a first conductive layer 271. A top surface of the first conductive layer 271 may be lower than a top surface of the first dielectric layer 231. Fourth trenches 261 may be formed on the first conductive layer 271 in the first dielectric layer 231.

The fourth trenches 261 may be formed when forming the first conductive layer 271.

The fourth trenches 261 may provide space for subsequent formation of the insulation layer.

The portion of the first initial conductive layer 270 may be etched back by a dry etching process or a wet etching process.

In one embodiment, the portion of the first initial conductive layer 270 may be etched back by the dry etching process.

The insulation layer may be formed in the fourth trenches 261 subsequently, and a depth of the fourth trenches 261 may determine a thickness of an insulation layer 202 formed subsequently.

Figure 10:
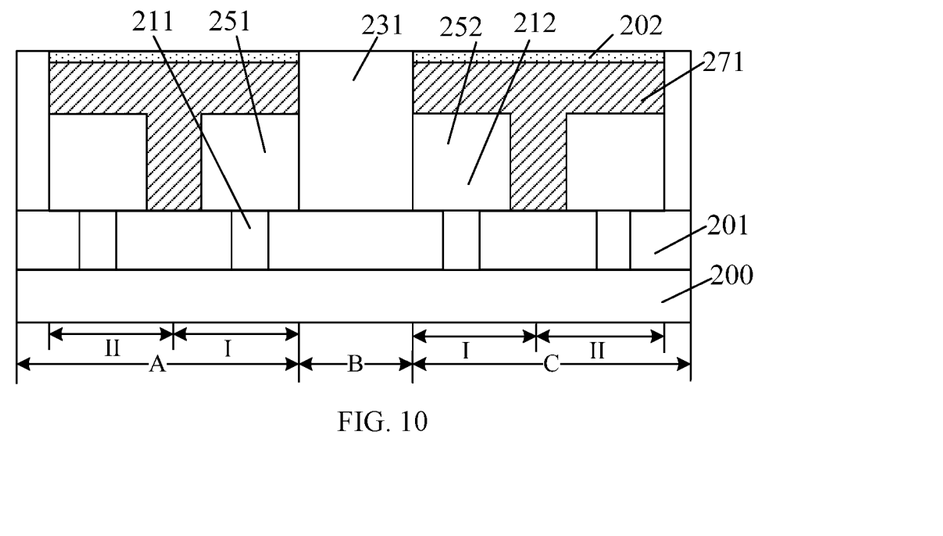

Referring to FIG. 10, the insulation layer 202 may be formed in the fourth trenches 261. The material of the insulation layer 202 may be different from the material of the first dielectric layer 231 and may also be different from the material of the second dielectric layer 232.

The insulation layer 202 may be made of a material including silicon carbide, silicon carbonitride or silicon oxycarbide.

The method for forming the insulation layer 202 may include: after forming the first conductive layer 270, forming an initial insulation layer (not shown) in the fourth trenches 261 and on the surface of the first dielectric layer 231; and planarizing the initial insulation layer till exposing the top surface of the first dielectric layer 231 to form the insulation layer 202 in the fourth trenches 261.

The material of the insulation layer 202 may be different from the material of the second dielectric layer 232. When the second dielectric layer 232 is subsequently etched to form the second trenches and a third trench, a gas having a large etching selectivity for the second dielectric layer 232 and the insulation layer 202 may be selected, which may protect the first dielectric layer 231 under the insulation layer 202 and ensure the isolation between the first conductive layer 271 and the third conductive layer subsequently formed in the third trench.

The material of the insulation layer 202 may be different from the material of the first dielectric layer 231. When the second dielectric layer 232 and the first dielectric layer 231 are etched, a gas having a large etching selectivity for the first dielectric layer 231 and the insulation layer 202 may be selected, which may protect the first dielectric layer 231 under the insulation layer 202.

In one embodiment, the material of the first dielectric layer 231 may be silicon oxide and the material of the insulation layer 203 may be silicon carbide.

The insulation layer 202 may cover the top surface of the first conductive layer 271, which may prevent the first conductive layer 271 from being short-circuited with the third conductive layer formed subsequently.

The thickness of the insulation layer 202 may be about 10 nm to about 40 nm.

If the thickness of the insulation layer 202 is too small, the insulation effect may be limited, and leakage may easily occur between the first conductive layer 271 and the third conductive layer formed subsequently. If the thickness of the insulation layer 202 is too large, the size of the first conductive layer 271 may be too small, which may cause poor performance of the formed semiconductor device.

Figure 11:
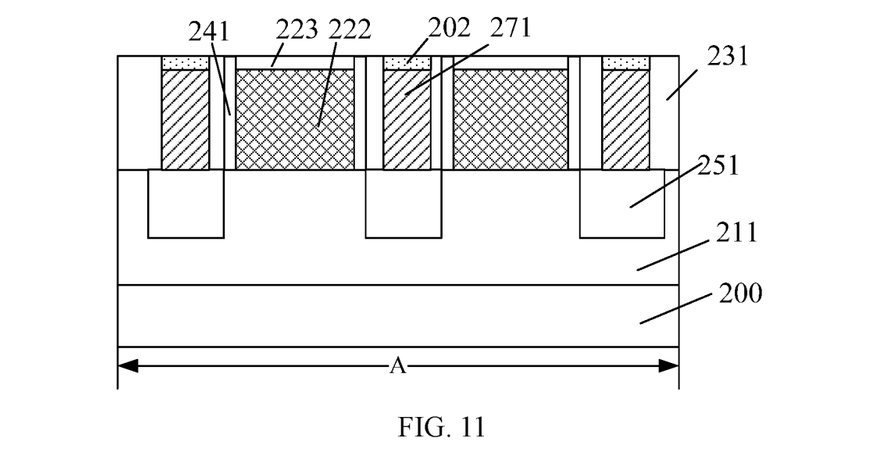

Referring to FIG. 11, the cross-sectional directions of FIG. 11 and FIG. 5 are consistent. After forming the insulation layer 202, the first dummy gate structure 220 may be removed to form a gate opening in the first dielectric layer 231, and a first gate structure 222 may be formed in the gate opening.

The first gate structure 222 may have a contact region 2221 at the second region B.

The contact region 2221 of the first gate structure 222 may be the contact region 2201 of the first dummy gate structure 220.

A distance between the second sub-region II and the contact region 2201 of the first dummy gate structure 220 may be the same as a distance between the second sub-region II and the contact region 2221 of the first gate structure 222.

A minimum distance between the second sub-region II and the contact region 2221 of the first gate structure 222 may be greater than zero.

The first gate structure 222 may include a gate dielectric layer and a gate electrode layer on the gate dielectric layer. The gate dielectric layer may be made of a high K (K greater than 3.9) dielectric material. The gate electrode layer may be made of a metal including tungsten.

A first gate protection layer 223 may be on the top of the first gate structure 222 and protect the gate electrode layer.

In one embodiment, after forming the first dielectric layer and before forming the first trench, the first gate structure may be formed.

Figure 12:
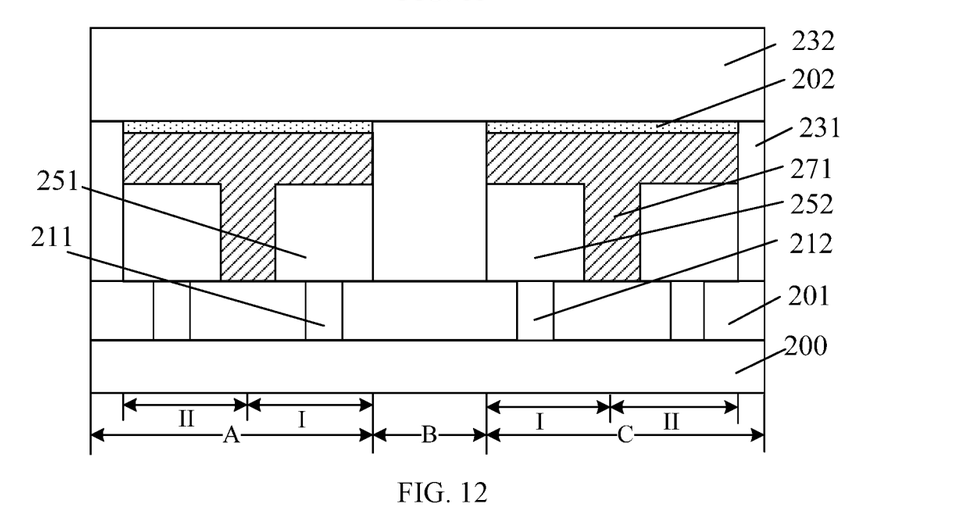

Referring to FIG. 12, the cross-sectional directions in FIG. 12 and FIG. 10 are consistent. After forming the first gate structure 222, a second dielectric layer 232 may be formed on the first dielectric layer 231 and may cover the top surfaces of the first gate structure 222 and the insulation layer 202.

The second dielectric layer 232 may implement interlayer isolation.

The second dielectric layer 232 is made of a material including silicon oxide, silicon nitride, silicon boronitride, silicon oxycarbonitride, silicon oxynitride, In one embodiment, the material of the second dielectric layer 232 may be silicon oxide.

The forming process of the second dielectric layer 232 may be a deposition process such as a chemical vapor deposition process, a physical vapor deposition process or an atomic layer deposition process.

The second conductive layer may be formed in the second dielectric layer. The second conductive layer may be on the first conductive layer at the second sub-regions. The third conductive layer which is connected to the contact region of the first gate structure may be formed in the second dielectric layer at the second region.

The first conductive layer and the second conductive layer may be conductive together as a connecting layer between the first metal interconnect layer formed subsequently and each of the first doped layer and the second doped layer. The third conductive layer may be configured to connect the first metal interconnect layer formed subsequently and the first gate structure.

In one embodiment, the third conductive layer may be formed after forming the second conductive layer.

The method for forming the second conductive layer may include: forming second trenches in the second dielectric layer at the second sub-regions of the first trenches, where the second trenches may expose a portion of the first conductive layer; forming a second conductive material layer in the second trenches and on the second dielectric layer; and planarizing the second conductive material layer till exposing the surface of the dielectric layer to form the second conductive layer in the second trenches.

The method for forming the third conductive layer may include: forming third trenches in the second dielectric layer at the second region, where the third trench may expose the first gate structure; forming a third conductive material layer in the third trench and on the second dielectric layer; and planarizing the third conductive material layer till exposing the surface of the second dielectric layer to form the third conductive layer in the third trench.

In one embodiment, the third conductive layer may be formed when forming the second conductive layer.

Figure 13:
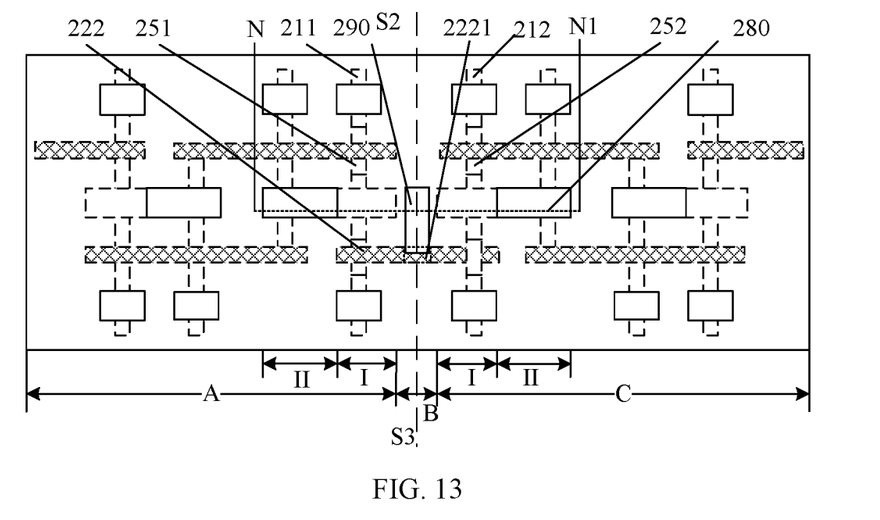
Figure 14:
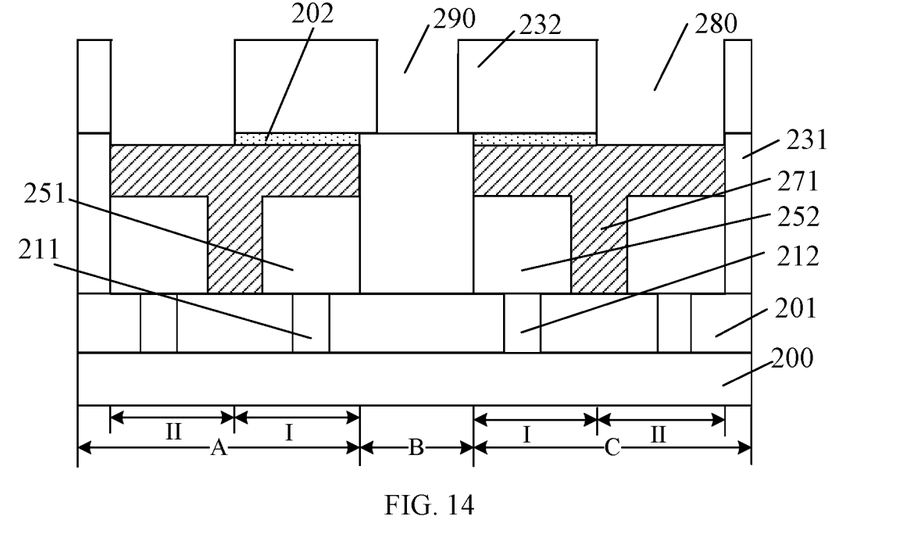

Referring to FIG. 13 and FIG. 14, FIG. 14 illustrates a cross-sectional schematic along a section line N-N1 in FIG. 13. After forming the second dielectric layer 232, second trenches 280 may be formed in the second dielectric layer 232 at the second sub-regions II. The second trenches 280 may expose a portion of the first conductive layer. A third trench 290 may be formed in the second dielectric layer 232 at the second regions B. The third trench 290 may expose a portion of the surface of the contact region 2221 of the first gate structure 222.

The second trenches 280 may provide space for the subsequent formation of the second conductive layer.

The third trench 290 may provide space for the subsequent formation of the third conductive layer.

In one embodiment, the third trench 290 may be formed when forming the second trenches 280.

The method for forming the second trenches 280 and the third trench 290 may include: forming a second pattern layer (not shown) on the surface of the second dielectric layer 232, where the pattern layer may expose a portion of the surface of the second dielectric layer 232; and using the pattern layer as a mask, etching the second dielectric layer 232, the insulation layer 202 and the first gate protection layer 223 till exposing the top surface of the first conductive layer 271 and a portion of the top surface of the contact region 2221 of the first gate structure 222 and respectively forming the second trenches 280 and the third trench 290.

In one embodiment, the third trench 290 may be formed after forming the second trenches 280.

In one embodiment, the second trenches 280 may be formed after forming the third trench 290.

Figure 15:
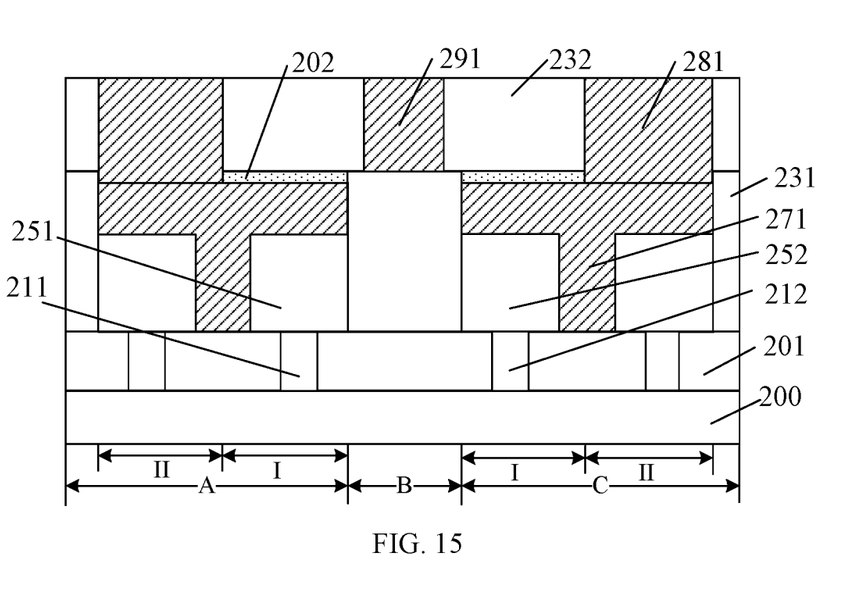
Figure 16:
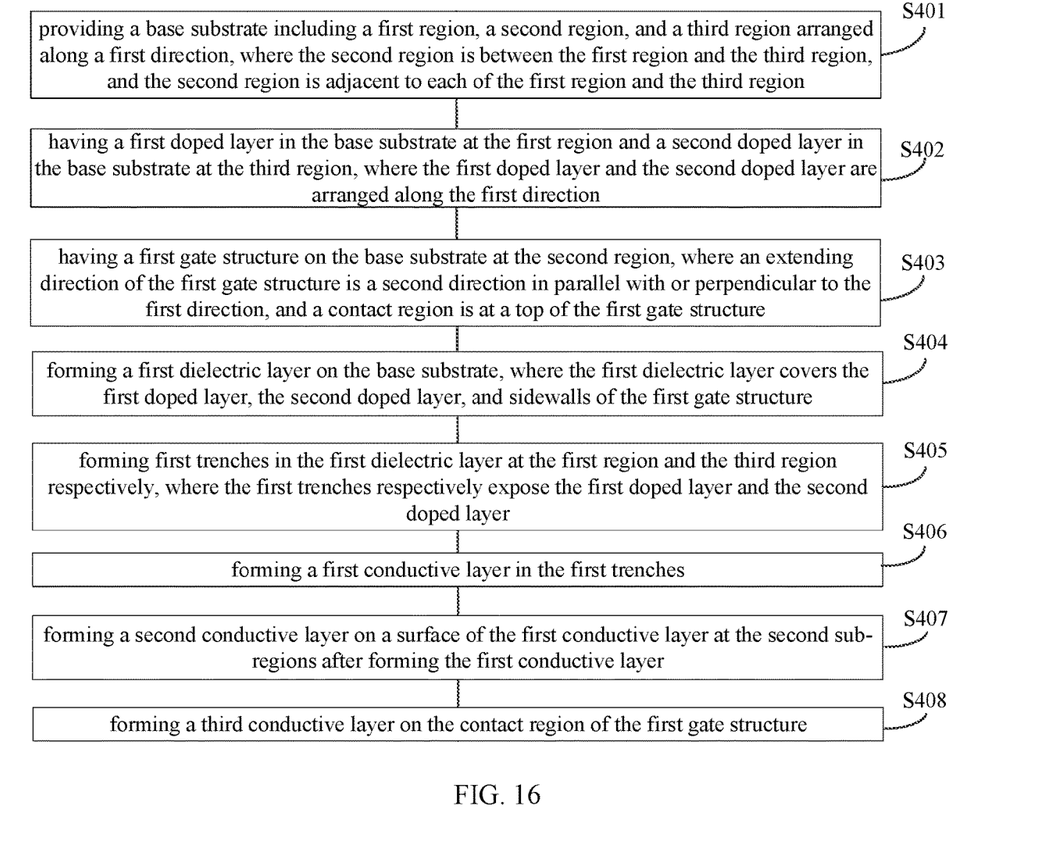
FIG. 16 illustrates a flowchart of an exemplary fabrication method for forming a semiconductor device according to various disclosed embodiments of the present disclosure.

Referring to FIG. 15, a second conductive layer 281 may be formed in the second trenches 280, and a third conductive layer 291 may be formed in the third trench 290 (e.g., in S407 and S408 of FIG. 16).

In one embodiment, the method for forming the second conductive layer 281 and the third conductive layer 291 may include: forming an initial conductive material layer (not shown) in the second trenches 280, in the third trench 290 and on the surface of the second dielectric layer 232; and planarizing the initial conductive material layer till exposing the surface of the second dielectric layer 232, and forming the second conductive layer 281 in the second trenches 280 and forming the third conductive layer 291 in the third trench 290.

The second conductive layer 281 and the third conductive layer 291 may be made of a metal including tungsten, cobalt, titanium or nickel.

In one embodiment, the material of the second conductive layer 281 and the third conductive layer 291 may be tungsten.

The initial conductive material layer may be formed by a deposition process including a chemical vapor deposition process, a physical vapor deposition process or an atomic layer deposition process.

In other embodiments, the third conductive layer 291 may be formed after forming the second conductive layer 281.

In one embodiment, the second conductive layer 281 may be formed after forming the third conductive layer 291.

The first conductive layer 271 may cover the first doped layer 251 and the second doped layer 252. The first conductive layer 271 and the second conductive layer 281 may be interconnected. The first conductive layer 271 together with the second conductive layer 281 may make the first metal interconnect layer formed subsequently to be conductive to the first doped layer 251 and the second doped layer 252.

The minimum distance between the second sub-region II and the contact region 2221 of the first gate structure 222 may be greater than zero. The second conductive layer 281 may be on the first conductive layer 271 at the second sub-region II, and the third conductive layer 291 may be on the contact region 2221 of the first gate structure 222. In such way, the minimum distance between the second conductive layer 281 and the third conductive layer 291 may be greater than zero. The minimum distance between the second conductive layer 281 and the third conductive layer 291 may be adjusted by controlling the distance between the second sub-region II and the contact region 2221 of the first gate structure 222, which may prevent leakage between the second conductive layer 281 and the third conductive layer 291. In such way, the isolation effect between the second conductive layer 281 and the third conductive layer 291 may be improved, thereby improving the performance of the semiconductor device.

Correspondingly, the present disclosure also provides a semiconductor device fabricated by any of the above-mentioned embodiments. Referring to FIG. 15, the semiconductor device may include: the base substrate including the first region A, the second region B, and the third region C arranged in the first direction, where the second region B may be between the first region A and the third region C, and the second region B may be adjacent to each of the first region A and the third region C; the first doped layer 251 in the base substrate at the first region A and the second doped layer 252 in the base substrate at the third region C, where the first doped layer 251 and the second doped layer 252 may be arranged in the first direction; the first gate structure 222 on the base substrate at the second region B, where the extending direction of the first gate structure 222 may be the second direction in parallel with or perpendicular to the first direction and the contact region may be at the top of the first gate structure; the first dielectric layer 231 on the base substrate, where the first dielectric layer 231 may cover the first doped layer 251, the second doped layer 252, and the sidewalls of the first gate structure 222; the first trenches in the first dielectric layer 231 at the first region A and the third region C respectively, where the bottoms of first trenches may respectively expose the first doped layer 251 and the second doped layer 252, the first trenches may include the second sub-regions II arranged in the direction in parallel with the second direction, and the minimum distance between the second sub-region II and the contact region of the first gate structure 222 may be greater than zero; the first conductive layer 271 in the first trenches; the second conductive layer 281 on the surface of the first conductive layer 271 at the second sub-regions II; and the third conductive layer 291 on the contact region of the first gate structure 222.

The material, structure and position of the first conductive layer 271 may refer to the above-mentioned embodiments of the present disclosure, which may not be described in detail.

The material, structure and position of the second conductive layer 281 may refer to the above-mentioned embodiments of the present disclosure, which may not be described in detail.

The material, structure and position of the third conductive layer 291 may refer to the above-mentioned embodiments of the present disclosure, which may not be described in detail.

From the above-mentioned embodiments, it can be seen that the technical solution provided by the present disclosure may achieve at least the following beneficial effects.

In the fabrication method of the semiconductor device provided by the technical solution of the present disclosure, the first conductive layer may cover the first doped layer and the second doped layer; the first conductive layer and the second conductive layer may be interconnected; the first conductive layer together with the second conductive layer may make the first metal interconnect layer to be conductive to each of the first doped layer and the second doped layer. In addition, the minimum distance between the second sub-region and the contact region of the first gate structure may be greater than zero; the second conductive layer may be on the first conductive layer at the second sub-region; and the third conductive layer may be on the contact region of the first gate structure. Therefore, the minimum distance between the second conductive layer and the third conductive layer may be greater than zero; and the minimum distance between the second conductive layer and the third conductive layer may be adjusted by controlling the distance between the second sub-region and the contact region of the first gate structure, which may prevent leakage between the second conductive layer and the third conductive layer. In such way, the isolation effect between the second conductive layer and the third conductive layer may be improved, thereby improving the performance of the semiconductor device.

Furthermore, the insulation layer may cover the top surface of the first conductive layer. Even if an etching misalignment occurs during the formation of the third conductive layer, the short circuit between the first conductive layer and the third conductive layer may still be prevented, thereby improving the performance of the semiconductor device.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A fabrication method of a semiconductor device, comprising:
   providing a base substrate including a first region, a second region, and a third region arranged along a first direction, wherein the second region is between the first region and the third region, and the second region is adjacent to each of the first region and the third region;
   a first doped layer in the base substrate at the first region and a second doped layer in the base substrate at the third region, wherein the first doped layer and the second doped layer are arranged along the first direction;
   a first gate structure on the base substrate at the second region, wherein an extending direction of the first gate structure is a second direction in parallel with or perpendicular to the first direction, and a contact region is at a top of the first gate structure;
   forming a first dielectric layer on the base substrate, wherein the first dielectric layer covers the first doped layer, the second doped layer, and sidewalls of the first gate structure;
   forming first trenches in the first dielectric layer at the first region and the third region respectively, wherein the first trenches respectively expose the first doped layer and the second doped layer, each first trench includes a first sub-region adjacent to the second region and a second sub-region away from the second region, arranged along a direction in parallel with the second direction, and a minimum distance between a second sub-region and the contact region of the first gate structure is greater than zero;
   forming a first conductive layer in the first trenches;
   forming a second conductive layer on a surface of the first conductive layer at the second sub-regions after forming the first conductive layer; and
   forming a third conductive layer on the contact region of the first gate structure.

2. The method according to claim 1, wherein:
   in the second direction, a minimum distance between the first sub-region and the contact region of the first gate structure is less than the minimum distance between the second sub-region and the contact region of the first gate structure.

3. The method according to claim 1, wherein:
   after forming the first conductive layer, a second dielectric layer is formed on the first dielectric layer, and covers a top surface of the first gate structure;
   the second conductive layer is formed in the second dielectric layer, wherein the second conductive layer is on the first conductive layer at the second sub-regions; and
   the third conductive layer which is connected to the contact region of the first gate structure is formed in the second dielectric layer at the second region.

4. The method according to claim 3, wherein forming the second conductive layer includes:

forming second trenches in the second dielectric layer, wherein the second trenches expose the first conductive layer in the second sub-regions;
forming a second conductive material layer in the second trenches and on the second dielectric layer; and
planarizing the second conductive material layer till exposing a surface of the second dielectric layer to form the second conductive layer in the second trenches.

5. The method according to claim 3, wherein forming the third conductive layer includes:
forming a third trench in the second dielectric layer in the second region, wherein the third trench exposes the contact region of the first gate structure;
forming a third conductive material layer in the third trench and on the second dielectric layer; and
planarizing the third conductive material layer till exposing the surface of the second dielectric layer to form the third conductive layer in the third trench.

6. The method according to claim 1, wherein:
the third conductive layer is formed after forming the second conductive layer.

7. The method according to claim 1, wherein:
the third conductive layer is formed when forming the second conductive layer.

8. The method according to claim 7, wherein:
the second dielectric layer is formed on the first dielectric layer after forming the first conductive layer, wherein the second dielectric layer covers the top surface of the first gate structure;
the second trenches and the third trench are formed in the second dielectric layer, wherein the second trenches expose the first dielectric layer at the second sub-regions and the third trench exposes the contact region of the first gate structure; and
forming the second conductive layer and the third conductive layer includes:
forming an initial conductive material layer in the second trenches and the third trench and on the surface of the second dielectric layer; and
planarizing the initial conductive material layer till exposing the surface of the second dielectric layer to form the second conductive layer in the second trenches and form the third conductive layer in the third trench.

9. The method according to claim 1, wherein forming the first conductive layer includes:
forming a first conductive material layer in the first trenches and on the first dielectric layer; and
planarizing the first conductive material layer till exposing the surface of the first dielectric layer to form the first conductive layer in the first trenches.

10. The method according to claim 1, before forming the second dielectric layer, further including:
forming an insulation layer on a top surface of the first conductive layer, wherein a material of the insulation layer is different from a material of the first dielectric layer, and also different from a material of the second dielectric layer.

11. The method according to claim 10, wherein:
the insulation layer is made of a material including silicon carbide, silicon carbonitride, silicon oxycarbide, or a combination thereof.

12. The method according to claim 10, wherein:
a thickness of the insulation layer is about 10 nm to about 40 nm.

13. The method according to claim 10, wherein forming the insulation layer and the first conductive layer includes:
forming a first initial conductive layer in the first trenches;
etching back a portion of the first initial conductive layer to form the first conductive layer, wherein the top surface of the first conductive layer is lower than a top surface of the first dielectric layer;
forming fourth trenches on a top of the first conductive layer in the first dielectric layer;
forming an initial insulation layer in the top regions of the first trenches and on the first dielectric layer; and
planarizing the initial insulation layer till exposing the top surface of the first dielectric layer to form the insulation layer.

14. The method according to claim 1, further including:
after forming the first conductive layer and before forming the second dielectric layer, forming the first gate structure.

15. The method according to claim 1, further including:
after forming the first dielectric layer and before forming the first trenches, forming the first gate structure.

16. The method according to claim 1, wherein:
a minimum distance between an edge of the second sub-region and an edge of the first gate structure is about 5 nm along a direction in parallel with the extending direction of the first gate structure.

17. The method according to claim 1, wherein:
the base substrate further includes a first device region and a second device region adjacent to the first device region;
the first region and a portion of the second region are in the first device region;
the third region and a portion of the second region are in the second device region; and
the first device region and the second device region are symmetrically distributed along an axis coincided with a centerline of the second region.

18. The method according to claim 17, wherein:
a first fin and a second fin are on the base substrate;
the first fin is at the first region of the base substrate and the second fin is at the third region of the base substrate;
the first gate structure is at the first region, the second region and the third region of the base substrate;
the extending direction of the first gate structure is in parallel with the first direction;
the first gate structure crosses the first fin and the second fin and also covers a portion of sidewall surfaces and top surfaces of the first fin and the second fin; and
the first doped layer is in the first fin on both sides of the first gate structure, and the second doped layer is in the second fin on both sides of the first gate structure.

19. The method according to claim 1, wherein:
a first fin and a second fin are on the base substrate;
an extending direction of the first fin and the second fin is in parallel with the first direction;
the first fin and the second fin are at the first region, the second region and the third region of the base substrate;
the extending direction of the first gate structure is perpendicular to the first direction;
the first gate structure crosses the first fin and the second fin; and
the first doped layer and the second doped layer are in the first fin and the second fin on both sides of the first gate structure.

* * * * *